(12) United States Patent
Sakamoto et al.

(10) Patent No.: US 11,822,124 B2
(45) Date of Patent: Nov. 21, 2023

(54) OPTICAL MULTIPLEXING CIRCUIT AND LIGHT SOURCE

(71) Applicant: Nippon Telegraph and Telephone Corporation, Tokyo (JP)

(72) Inventors: Junji Sakamoto, Musashino (JP); Toshikazu Hashimoto, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 126 days.

(21) Appl. No.: 17/437,688

(22) PCT Filed: Apr. 16, 2019

(86) PCT No.: PCT/JP2019/016361
§ 371 (c)(1),
(2) Date: Sep. 9, 2021

(87) PCT Pub. No.: WO2020/213064
PCT Pub. Date: Oct. 22, 2020

(65) Prior Publication Data
US 2022/0196912 A1 Jun. 23, 2022

(51) Int. Cl.
*G02B 6/12* (2006.01)
*G02B 6/125* (2006.01)
(Continued)

(52) U.S. Cl.
CPC ........... *G02B 6/125* (2013.01); *G02B 6/4207* (2013.01); *H01S 5/0225* (2021.01); *G02B 2006/12164* (2013.01)

(58) Field of Classification Search
CPC .................. G02B 6/12016; G02B 6/12019; G02B 6/125; G02B 6/4204
See application file for complete search history.

(56) References Cited

U.S. PATENT DOCUMENTS

2017/0146744 A1* 5/2017 Katsuyama ........ G02B 27/0172
2017/0357054 A1* 12/2017 Sugiyama .......... G02B 6/29398
(Continued)

FOREIGN PATENT DOCUMENTS

JP 2005-70365 A 3/2005
WO WO-2020240798 A1 * 12/2020 ......... G02B 6/12016

*Primary Examiner* — Eric Wong
(74) *Attorney, Agent, or Firm* — Workman Nydegger

(57) ABSTRACT

An optical multiplexing circuit includes a plurality of branching units configured to each divide light output from a corresponding one of a plurality of input waveguides, a multiplexing unit configured to multiplex a plurality of first beams of the light, each obtained by dividing the light by a corresponding one of the plurality of branching units, an output waveguide configured to output the light multiplexed by the multiplexing unit, a plurality of monitoring filters configured to individually input, via a first monitoring waveguide, a corresponding one of a plurality of second beams of the light, a wavelength through each of the plurality of monitoring filters having a transmittance of 50% being set to be a center wavelength of the plurality of second beams of the light, and a change in wavelength due to an assumed change in temperature being set to be less than half of an FSR, and a plurality of second monitoring waveguides.

7 Claims, 6 Drawing Sheets

(51) Int. Cl.
*H01S 5/0225* (2021.01)
*G02B 6/42* (2006.01)

(56) References Cited

U.S. PATENT DOCUMENTS

2018/0128979 A1* 5/2018 Heanue .............. G02B 6/12026
2021/0152794 A1* 5/2021 Yamada ............... H04N 9/3129
2022/0229235 A1* 7/2022 Sakamoto .......... G02B 6/12016

* cited by examiner

OPTICAL MULTIPLEXING CIRCUIT AND LIGHT SOURCE

TECHNICAL FIELD

The present invention relates to an optical multiplexing circuit and a light source, and more particularly to an optical multiplexing circuit capable of multiplexing light of a plurality of wavelengths such as three primary colors of light and monitoring the intensity of light of each wavelength, and a light source including the optical multiplexing circuit.

BACKGROUND ART

In recent years, a small light source including laser diodes (LDs) that output light of three primary colors of red light (R), green light (G), and blue light (B) as a light source to be applied to a glasses-type terminal and a small pico projector has been developed. Since LDs have a higher directionality than LEDs, a focus-free projector can be realized. Further, since LDs have a high light emission efficiency and a low power consumption, and also a high color reproducibility, LDs have recently been attracting attention.

FIG. 1 illustrates a typical light source of a projector using LDs. The light source for the projector includes LDs 1 to 3 that output light of a single wavelength of respective colors of R, G, and B, lenses 4 to 6 that collimate the light output from the LDs 1 to 3, and dichroic mirrors 10 to 12 that multiplex the respective light and output the light to a MEMS mirror 16. RGB light combined into a single beam is swept by using the MEMS mirror 16 or the like and is synchronized with modulation of the LDs, and thus a video is projected onto a screen 17. Half mirrors 7 to 9 are respectively inserted between the lenses 4 to 6 and the dichroic mirrors 10 to 12, and white balance is adjusted by monitoring the divided light of each color by using photodiodes (PDs) 13 to 15.

In general, an LD emits light in a longitudinal direction of a resonator; however, because the accuracy when monitoring the rear side is poor, it is common to monitor the front side from which light is emitted (front monitoring). As illustrated in FIG. 1, for use as an RGB light source, bulk optical components such as the LDs 1 to 3, the lenses 4 to 6, the half mirrors 7 to 9, and the dichroic mirrors 10 to 12 need to be combined with a spatial optical system. Furthermore, for monitoring for an adjustment of white balance, since bulk components such as the half mirrors 7 to 9 and the PDs 13 to 15 are needed and the optical system increases in size, there is a problem in that a reduction in the size of the light source is hindered.

On the other hand, an RGB coupler using a planar lightwave circuit (PLC) instead of a spatial optical system with bulk components has been attracting attention (for example, see Non Patent Literature 1). In a PLC, an optical waveguide is produced on a planar substrate such as Si by patterning by photolithography or the like, and reactive ion etching, and a plurality of basic optical circuits (for example, a directional coupler, a Mach-Zehnder interferometer, and the like) are combined, and thus various functions can be realized (for example, see Non Patent Literatures 2 and 3).

FIG. 2 illustrates a basic structure of an RGB coupler using a PLC. An RGB coupler module including LDs 21 to 23 of respective colors of G, B, and R and a PLC-type RGB coupler 20 is illustrated. The RGB coupler 20 includes first to third waveguides 31 to 33 and first and second multiplexers 34 and 35 that multiplex light from two waveguides into a single waveguide. As methods using a multiplexer in an RGB coupler module, there are a method of using symmetrical directional couplers having the same waveguide width, a method of using a Mach-Zehnder interferometer (for example, see Non Patent Literature 1), and a method of using a mode coupler (for example, see Non Patent Literature 4), and the like.

By using a PLC, a spatial optical system using a lens, a dichroic mirror, or the like can be integrated on one chip. Further, since the LD of R and the LD of G have a weaker output than the LD of B, an RRGGB light source in which two LDs of R and two LDs of G are prepared is used. As described in Non Patent Literature 2, by using mode multiplexing, light of the same wavelength can be multiplexed in different modes, and an RRGGB coupler can also be easily realized by using a PLC.

FIG. 3 illustrates a configuration of an RGB coupler using two directional couplers. An RGB coupler 100 using the PLC includes first to third input waveguides 101 to 103, first and second directional couplers 104 and 105, and an output waveguide 106 connected to the second input waveguide 102.

A waveguide length, a waveguide width, and a gap between the waveguides are designed such that the first directional coupler 104 couples light of $\lambda 2$ incident from the first input waveguide 101 to the second input waveguide 102, and couples light of $\lambda 1$ incident from the second input waveguide 102 to the first input waveguide 101 and back to the second input waveguide 102. A waveguide length, a waveguide width, and a gap between the waveguides are designed such that the second directional coupler 105 couples light of $\lambda 3$ incident from the third input waveguide 103 to the second input waveguide 102, and passes light of $\lambda 1$ and $\lambda 2$ coupled to the second input waveguide 102 in the first directional coupler 104.

For example, green light G (wavelength $\lambda 2$) is incident on the first input waveguide 101, blue light B (wavelength $\lambda 1$) is incident on the second input waveguide 102, red light R (wavelength $\lambda 3$) is incident on the third input waveguide 103, and the three colors of light R, G, and B are multiplexed by the first and second directional couplers 104 and 105 and output from the output waveguide 106. Light of 450 nm, light of 520 nm, and light of 638 nm are used as the wavelengths of $\lambda 1$, 2, and 3, respectively.

However, the application of such an RGB coupler to configure a light source including a monitoring function for an adjustment of white balance has not been studied from the viewpoint of size reduction of the light source and accuracy of monitoring.

CITATION LIST

Non Patent Literature

Non Patent Literature 1: A. Nakao, R. Morimoto, Y. Kato, Y. Kakinoki, K. Ogawa and T. Katsuyama, "Integrated Waveguide-type Red-green-blue Beam Combiners for Compact Projection-type Displays", Optics Communications 320 (2014) 45-48

Non Patent Literature 2: Y. Hibino, "Arrayed-waveguide-grating Multi/Demultiplexers for Photonic Networks," IEEE CIRCUITS & DEVICES, November, 2000, pp. 21-27

Non Patent Literature 3: A. Himeno, et al., "Silica-based Planar Lightwave Circuits," J. Sel. Top. Q.E., vol. 4, 1998, pp. 913-924

Non Patent Literature 4: J. Sakamoto et al. "High-efficiency Multiple-light-source Red-green-blue Power Combiner with Optical Waveguide Mode Coupling Technique," Proc. of SPIE Vol. 10126 101260 M-2

SUMMARY OF THE INVENTION

An object of the present invention is to provide an optical multiplexing circuit capable of accurately monitoring light of a plurality of wavelengths by measuring a change in oscillation wavelength of a laser diode due to a change in temperature, and a light source including the optical multiplexing circuit.

According to the present invention, in order to achieve such an object, an embodiment of an optical multiplexing circuit includes a plurality of branching units configured to each divide light output from a corresponding one of a plurality of input waveguides, a multiplexing unit configured to multiplex a plurality of first beams of the light, each obtained by dividing the light by a corresponding one of the plurality of branching units, an output waveguide configured to output the light multiplexed by the multiplexing unit, a plurality of monitoring filters configured to individually input, via a first monitoring waveguide, a corresponding one of a plurality of second beams of the light, each obtained by dividing the light by a corresponding one of the plurality of branching units, a wavelength through each of the plurality of monitoring filters having a transmittance of 50% being set to be a center wavelength of the plurality of second beams of the light, and a change in wavelength due to an assumed change in temperature being set to be less than half of an FSR, and a plurality of second monitoring waveguides configured to each output an output of a corresponding one of the plurality of monitoring multiplexing units.

According to the present invention, since a change in oscillation wavelength of a laser diode due to a change in temperature can be measured as a change in light intensity of light received by a photodiode via a monitoring filter, it is possible to accurately monitor light of a plurality of wavelengths.

DESCRIPTION OF EMBODIMENTS

Hereinafter, embodiments of the present disclosure will be described in detail with reference to the drawings. In the present embodiment, description is given for the case of a method using a directional coupler as a multiplexer, but the present invention is not limited to a multiplexing method.

First Embodiment

Figure 4:
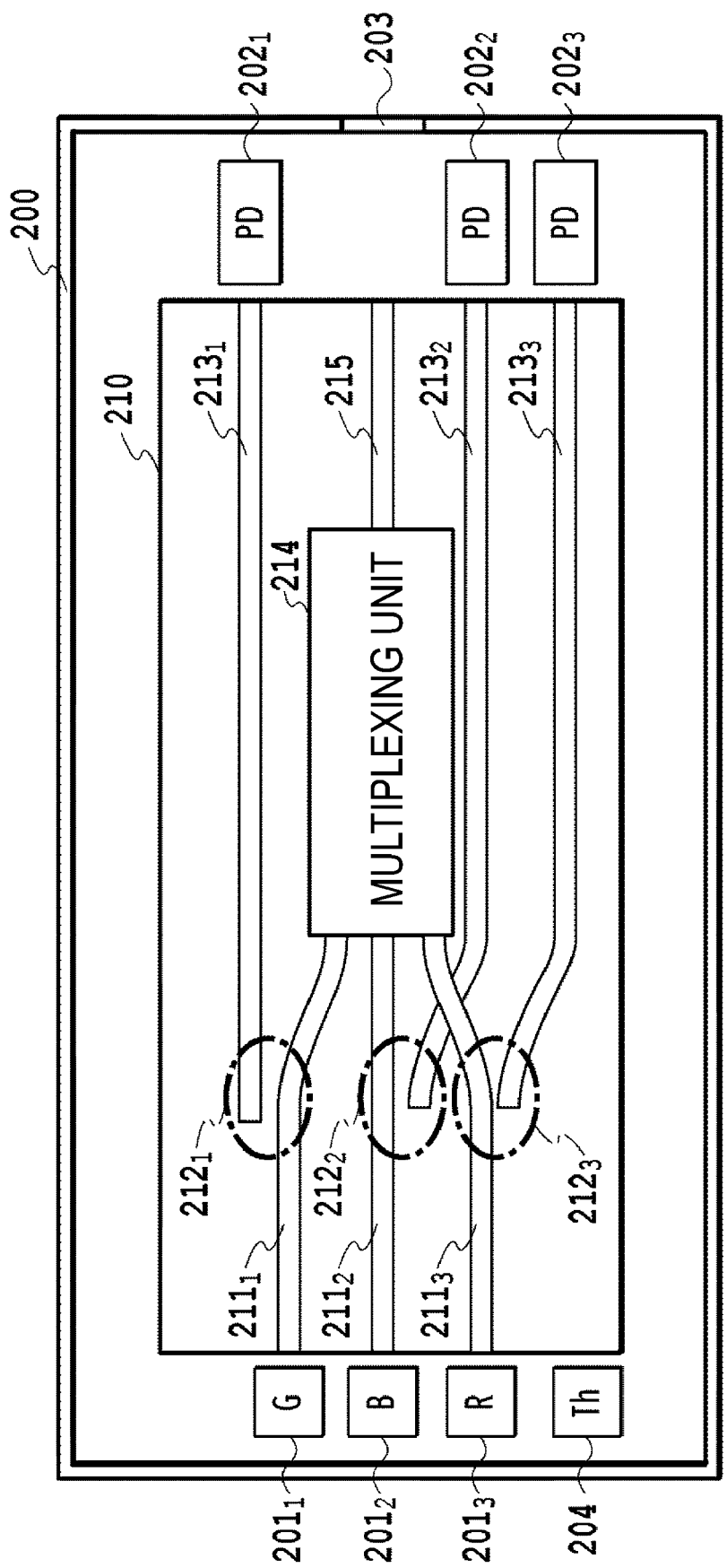
FIG. 4 is a diagram illustrating a light source with a monitoring function according to a first embodiment of the present invention.

FIG. 4 is a diagram illustrating a light source with a monitoring function according to a first example of a first embodiment of the present invention. A light source 200 with a monitoring function includes first to third LDs $201_1$ to $201_3$ that respectively output light of respective colors of G, B, and R, a PLC-type RGB coupler 210, and first to third PDs $202_1$ to $202_3$ optically connected to the RGB coupler 210.

An output of the RGB coupler 210 is taken out of a window 203 provided in a housing, and, for example, when the output is applied to a projector, a MEMS mirror is irradiated with the output.

Furthermore, the light source 200 with a monitoring function includes a thermistor 204. Since an oscillation wavelength of each of the LDs 201 fluctuates due to a change in temperature, feedback control is performed on the LDs 201 in accordance with the change in temperature.

The PLC-type RGB coupler 210 includes first to third input waveguides $211_1$ to $211_3$ optically connected to the first to third LDs $201_1$ to $201_3$, first to third branching units $212_1$ to $212_3$ that divide light propagating through the waveguide into two, a multiplexing unit 214 that multiplexes a plurality of first beams of the light, each obtained by dividing the light by a corresponding one of the first to third branching units $212_1$ to $212_3$, first to third monitoring waveguides $213_1$ to $213_3$ that output a plurality of second beams of the light, each obtained by dividing the light by a corresponding one of the first to third branching units $212_1$ to $212_3$, to corresponding ones of the first to third PDs $202_1$ to $202_3$, and an output waveguide 215 that outputs the light multiplexed by the multiplexing unit 214.

In the PLC-type RGB coupler 210, light incident on each of the first to third input waveguides $211_1$ to $211_3$ is divided into two by each of the first to third branching units $212_1$ to $212_3$. A plurality of first beams of the divided light are output to the first to third PDs $202_1$ to $202_3$ via the first to third monitoring waveguides $213_1$ to $213_3$, respectively, and a plurality of second beams of the divided light are multiplexed by the multiplexing unit 214 and output to the output waveguide 215.

Figure 1:
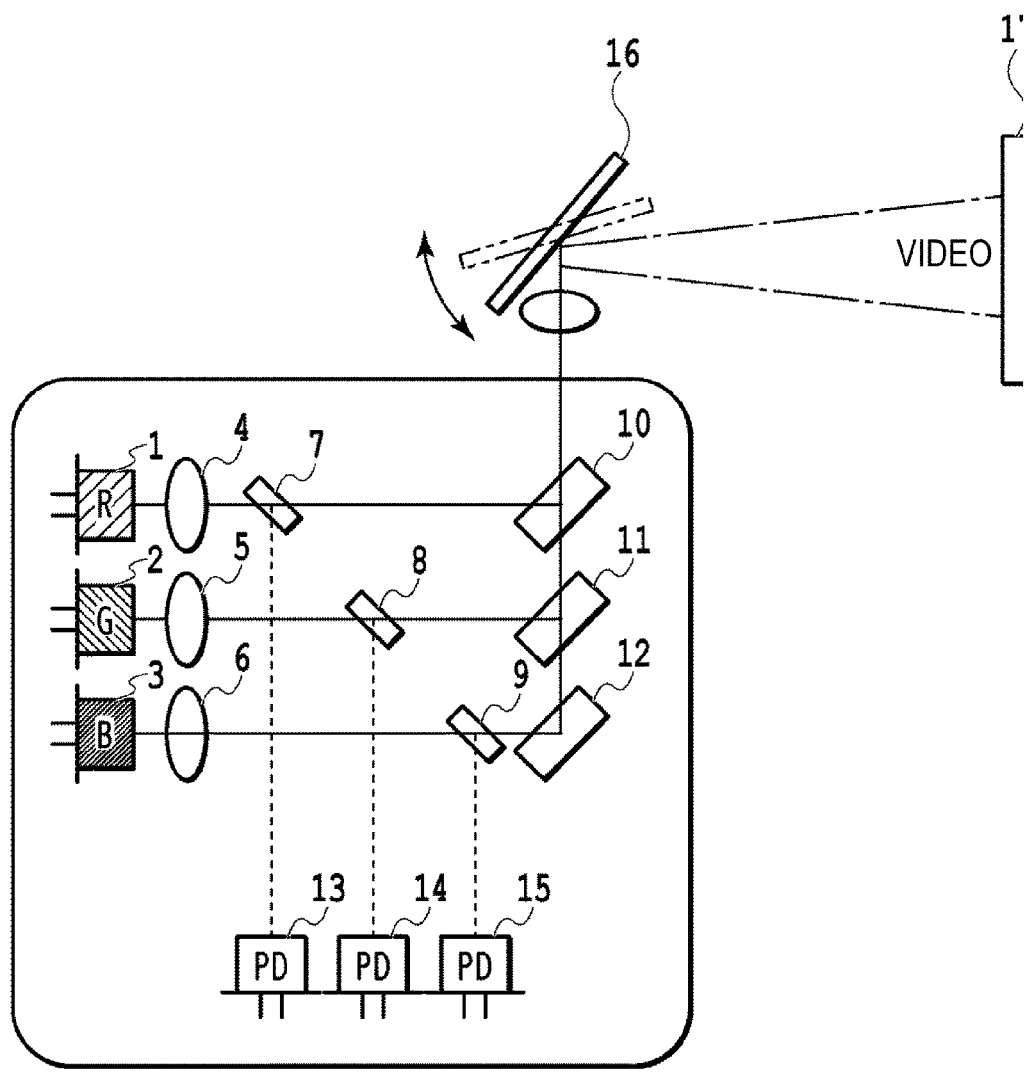
FIG. 1 is a diagram illustrating a typical light source of a projector using an LD.
Figure 2:
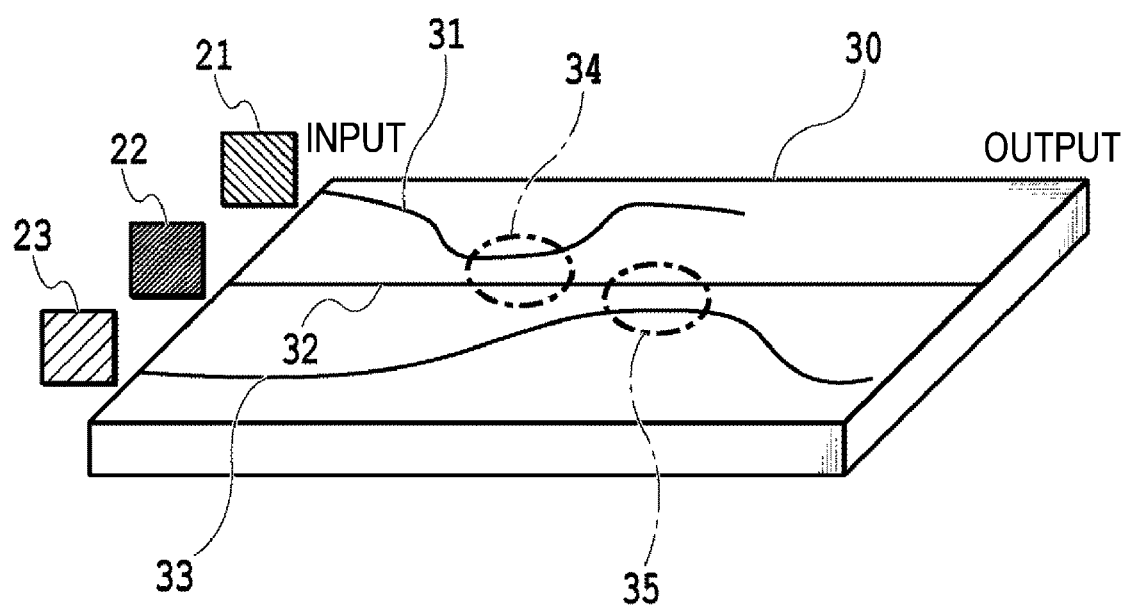
FIG. 2 is a diagram illustrating a basic structure of an RGB coupler using a PLC.
Figure 3:
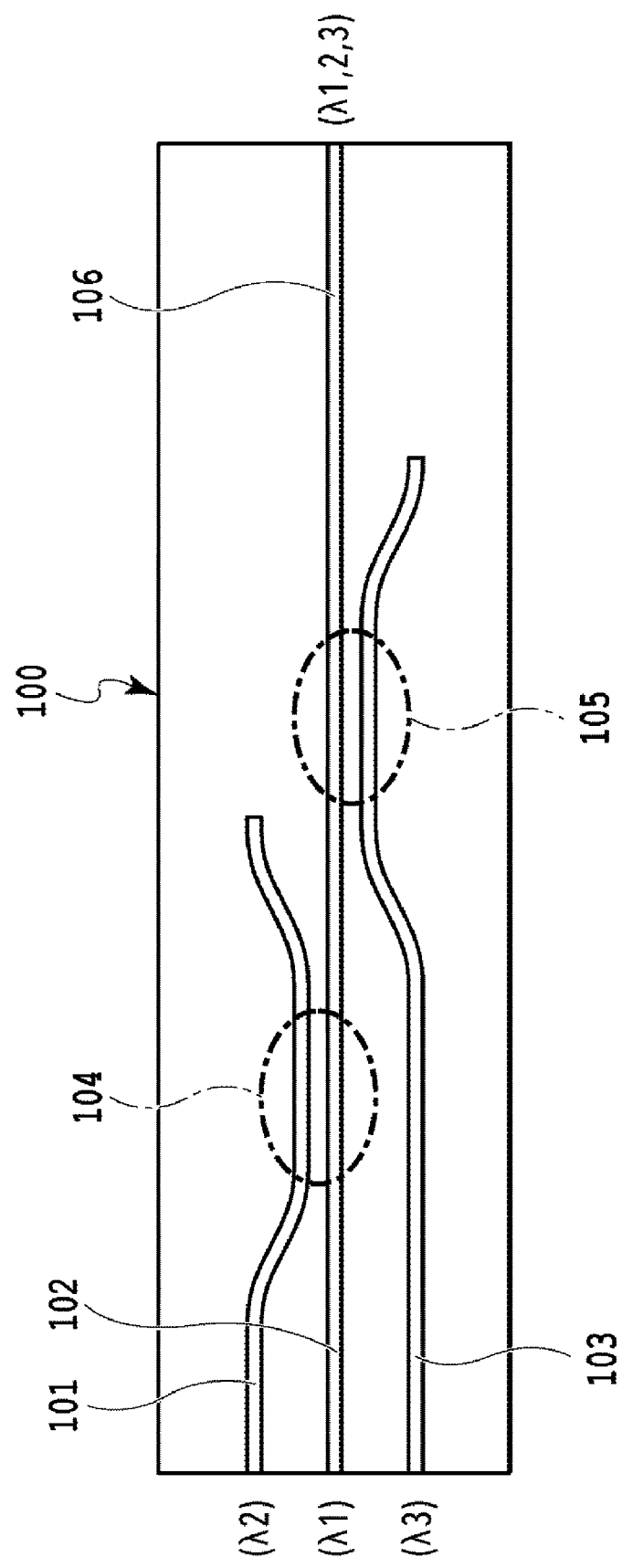
FIG. 3 is a diagram illustrating a configuration of an RGB coupler using two directional couplers.

An optical multiplexing circuit using the directional coupler illustrated in FIG. 3 can be used as the multiplexing unit 214. In this case, the first to third input waveguides $211_1$ to $211_3$ are coupled to the first to third input waveguides 101 to 103 illustrated in FIG. 3, respectively, and the output waveguide 215 is coupled to the output waveguide 106 illustrated in FIG. 3. However, the multiplexing unit 214 is not limited thereto, and another multiplexing unit of a waveguide type (for example, a Mach-Zehnder interferometer, a mode coupler, or the like) may be used.

As illustrated in FIG. 4, when light propagating through the first to third input waveguides $211_1$ to $211_3$ is divided by the first to third branching units $212_1$ to $212_3$, respectively, a coupling characteristic between the first to third LDs $201_1$ to $201_3$ and the first to third input waveguides $211_1$ to $211_3$ can be monitored. In addition, it is possible to adjust white balance as a light source by using a monitoring value of the first to third PDs $202_1$ to $202_3$ by recognizing a multiplexing characteristic of the multiplexing unit 214 in advance.

Second Embodiment

Configuration of Light Source

In the first embodiment, the thermistor 204 is disposed near the LDs 201 inside a package of the light source 200 with a monitoring function. However, in terms of heat radiation, the LDs 201 are mounted on the package via a mounting having excellent heat conductivity. Therefore, even when the thermistor 204 is disposed near the LDs 201, a temperature of each of the LDs 201 itself is not accurately measured. Further, it is common to perform a measurement with one thermistor without disposing a thermistor on each individual LD 201 due to mounting restrictions of the package. Therefore, a distance between each individual LD 201 and the thermistor 204 is also different, and a temperature of each individual LD 201 cannot be accurately measured.

Thus, in the second embodiment, a configuration is adopted where feedback control can be performed on the LD 201 by accurately monitoring a change in wavelength due to a change in temperature.

Figure 5:
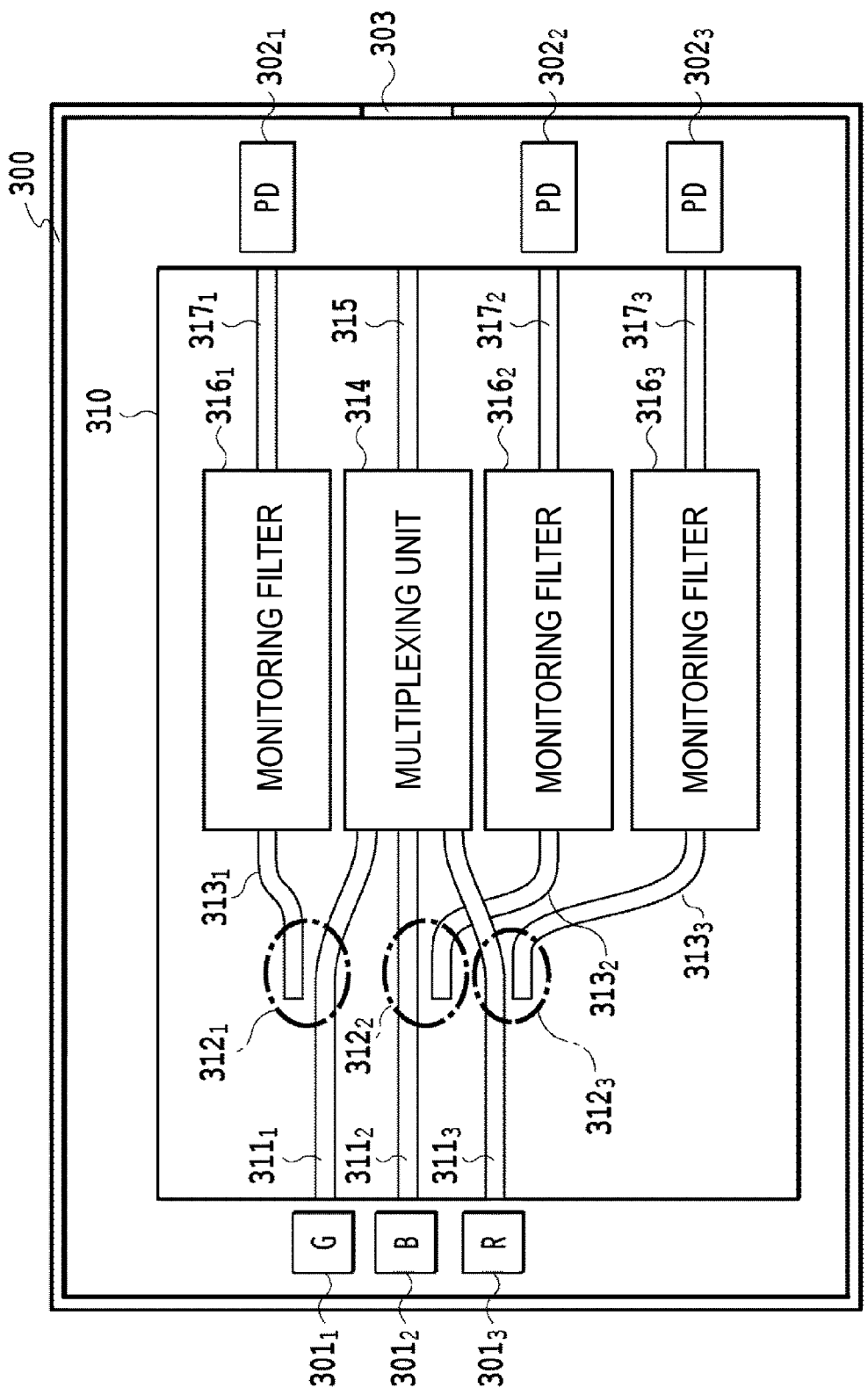
FIG. 5 is a diagram illustrating a light source with a monitoring function according to a second embodiment of the present invention.

FIG. 5 illustrates a light source with a monitoring function according to the second embodiment of the present invention. A light source 300 with a monitoring function includes first to third LDs $301_1$ to $301_3$ that respectively output light of respective colors G, B, and R, a PLC-type RGB coupler 310, and first to third PDs $302_1$ to $302_3$ optically connected to the RGB coupler 310. An output of the RGB coupler 310 is taken out of a window 303 provided in a housing, and, for example, when the output is applied to a projector, a MEMS mirror is irradiated with the output. The PLC-type RGB coupler 310 includes first to third input waveguides $311_1$ to $311_3$ optically connected to the first to third LDs $301_1$ to $301_3$, first to third branching units $312_1$ to $312_3$ that divide light propagating through the waveguide into two, a multiplexing unit 314 that multiplexes a plurality of first beams of the light, each obtained by dividing the light by a corresponding one of the first to third branching units $312_1$ to $312_3$, and an output waveguide 315 that outputs the light multiplexed by the multiplexing unit 214.

Furthermore, the RGB coupler 310 includes first to third monitoring waveguides $313_1$ to $313_3$ that output a plurality of second beams of the light, each obtained by dividing the light by a corresponding one of the first to third branching units $312_1$ to $312_3$, to corresponding ones of first to third monitoring filters $316_1$ to $316_3$, and first to third monitoring waveguides $317_1$ to $317_3$ that output an output of the first to third monitoring multiplexing units $316_1$ to $316_3$ to the first to third PDs $302_1$ to $302_3$.

The first to third monitoring filters $316_1$ to $316_3$ can measure, as a change in light intensity of the light received by the PDs 302, a change in the oscillation wavelength of the LDs 201 due to a change in temperature. Therefore, the monitoring filters 31 may be circuits having dependence on wavelength to the extent to which a change in the oscillation wavelength of the LDs 201 can be measured as a change in light intensity, and measurement is easy when the circuit has a strong dependence on wavelength. A change in temperature of the LDs 201 is estimated from the change in light intensity, and feedback control is performed on the LDs 201.

With such a configuration, a change in the temperature of the LDs 301 of the respective colors of R, G, and B can be accurately monitored without using a thermistor. As a result, color control can be performed with high accuracy, and white balance as a light source can also be adjusted with high accuracy.

Monitoring Filter

A specific example of a case where a directional coupler is applied as the monitoring filters 316 having dependence on wavelength will be described.

Figure 6A:
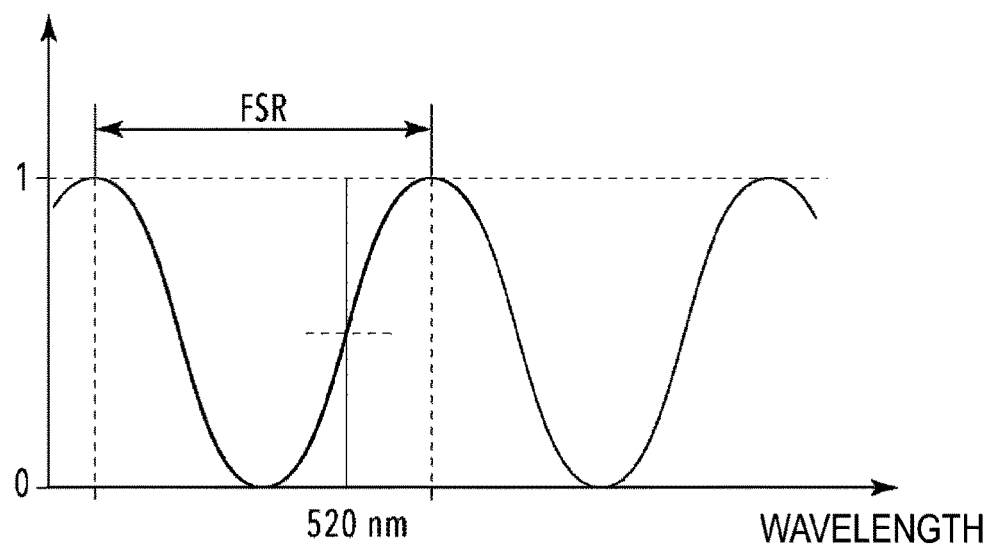
FIG. 6 is a diagram illustrating a dependence of the transmittance of a directional coupler on wavelength.
Figure 6B:
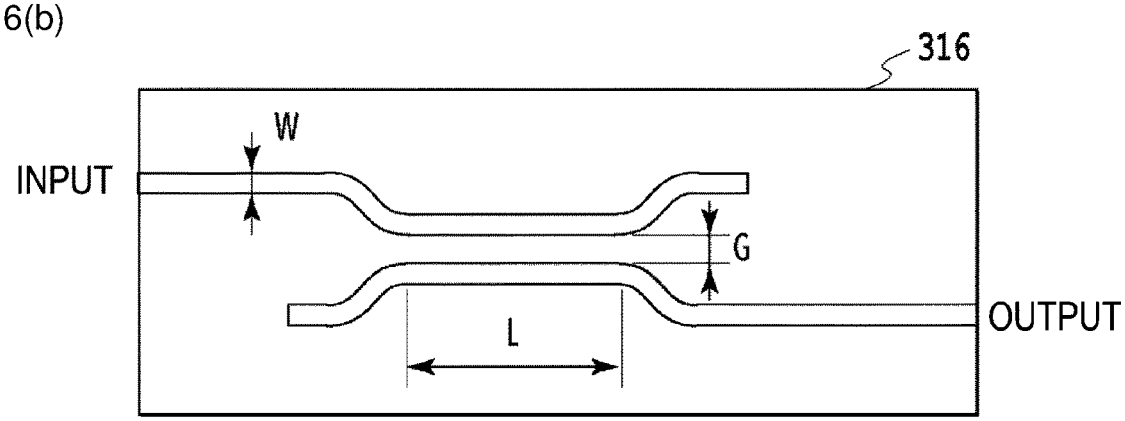

FIG. 6 illustrates a dependence of the transmittance of the directional coupler on wavelength. The first monitoring filter $316_1$ for monitoring green light G (wavelength $\lambda 2=520$ nm) is illustrated. In the directional coupler illustrated in FIG. 6(b), a core thickness H of a waveguide=1.75 μm, a specific refractive index difference $\Delta$ between waveguides=1.0%, a length L of the directional coupler=222 μm, a width W of the waveguide=1.5 μm, and a gap G between the waveguides=1.0 μm, and FIG. 6(a) illustrates transmittance when a crossport is an output with respect to an input port. When the first LD $301_1$ has an oscillation wavelength of 520 nm, transmittance is designed to be 49.6%.

In general, the wavelength of the semiconductor LD of visible light changes by approximately 3 nm with respect to a change in temperature of approximately 50 degrees. For example, when it is assumed that the oscillation wavelength changes by ±3 nm with respect to a change in temperature of 50 degrees, the output of the directional coupler illustrated in FIG. 6(b) has light intensity changed by approximately ±1.5% with respect to the change in the oscillation wavelength of ±3 nm. Therefore, sufficient measurement can be performed by a monitoring function using a conventional PD.

When a directional coupler is used, it is preferable to set the center wavelength of each of the LDs 301 at a point of transmittance of 50% at which a fluctuation of power is the greatest with respect to a change in wavelength. Further, it is necessary to set an FSR so as to monotonically decrease or monotonically increase in a range of an assumed change in wavelength. In other words, it is preferable to set a change in wavelength due to an assumed change in temperature so as to be less than half of the FSR.

Further, a monitoring filter to which a Mach-Zehnder (MZ) interferometer is applied can also be used instead of the directional coupler. In an asymmetric MZ, an output on a crossport side with respect to an input port is set to $\cos 2 (\pi n(\lambda) \Delta L/\lambda)$ with respect to a path length difference $\Delta L$ of two arm waveguides.

Here, $\lambda$ is a center wavelength of each of the LDs 301, and $n(\lambda)$ is a refractive index. A change in oscillation wavelength and, furthermore, a change in temperature can be indirectly determined by adjusting $\Delta L$ such that a necessary fluctuation of light intensity can be obtained for a desired wavelength range of the asymmetric MZ.

The invention claimed is:
1. An optical multiplexing circuit, comprising:
   a plurality of branching units configured to each divide light output from a corresponding one of a plurality of input waveguides;
   a multiplexing unit configured to multiplex a plurality of first beams of the light, each obtained by dividing the light by a corresponding one of the plurality of branching units;
   an output waveguide configured to output the light multiplexed by the multiplexing unit;
   a plurality of first monitoring waveguides configured to input a corresponding one of a plurality of second beams of the light, each obtained by dividing the light by a corresponding one of the plurality of branching units, into a plurality of monitoring filters, a wavelength through each of the plurality of monitoring filters having a transmittance of 50% being set to be a center wavelength of the plurality of second beams of the light, and a change in wavelength due to an assumed change in temperature being set to be less than half of an FSR; and
   a plurality of second monitoring waveguides that each output an output of a corresponding one of the plurality of monitoring filters.
2. The optical multiplexing circuit according to claim 1, wherein the plurality of monitoring filters are each a directional coupler.

3. The optical multiplexing circuit according to claim 1, wherein the plurality of monitoring filters are each a Mach-Zehnder interferometer.

4. A light source with a monitoring operation, comprising:
the optical multiplexing circuit according to claim 1;
a plurality of laser diodes each optically coupled to a corresponding one of the plurality of input waveguides; and
a plurality of photodiodes each optically coupled to a corresponding one of the plurality of second monitoring waveguides.

5. The light source with a monitoring operation according to claim 4, wherein the plurality of laser diodes are three laser diodes that output light of three primary colors of red light (R), green light (G), and blue light (B).

6. A light source with a monitoring operation, comprising:
the optical multiplexing circuit according to claim 2;
a plurality of laser diodes each optically coupled to a corresponding one of the plurality of input waveguides; and
a plurality of photodiodes each optically coupled to a corresponding one of the plurality of second monitoring waveguides.

7. A light source with a monitoring operation, comprising:
the optical multiplexing circuit according to claim 3;
a plurality of laser diodes each optically coupled to a corresponding one of the plurality of input waveguides; and
a plurality of photodiodes each optically coupled to a corresponding one of the plurality of second monitoring waveguides.

\* \* \* \* \*